(12) United States Patent
Wehlus

(10) Patent No.: US 9,692,005 B2
(45) Date of Patent: Jun. 27, 2017

(54) OPTOELECTRONIC DEVICE AND METHOD FOR PRODUCING AN OPTOELECTRONIC DEVICE

(71) Applicant: OSRAM OLED GmbH, Regensburg (DE)

(72) Inventor: Thomas Wehlus, Lappersdorf (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 14/443,939

(22) PCT Filed: Nov. 19, 2013

(86) PCT No.: PCT/EP2013/074174
§ 371 (c)(1),
(2) Date: May 19, 2015

(87) PCT Pub. No.: WO2014/079845
PCT Pub. Date: May 30, 2014

(65) Prior Publication Data
US 2015/0318512 A1    Nov. 5, 2015

(30) Foreign Application Priority Data
Nov. 20, 2012 (DE) .......................... 10 2012 221 191

(51) Int. Cl.
*H01L 51/52* (2006.01)
*H01L 51/56* (2006.01)

(52) U.S. Cl.
CPC .......... *H01L 51/5209* (2013.01); *H01L 51/52* (2013.01); *H01L 51/5212* (2013.01);
(Continued)

(58) Field of Classification Search
CPC . H01L 51/5209; H01L 51/52; H01L 51/5221; H01L 51/56; H01L 51/5225;
(Continued)

(56) References Cited

U.S. PATENT DOCUMENTS

| 8,791,490 B2 * | 7/2014 | Lang ................... H01L 51/5203 257/99 |
| 2002/0139986 A1 * | 10/2002 | Okada ................. H01L 51/5231 257/87 |

(Continued)

FOREIGN PATENT DOCUMENTS

| CN | 101128941 | 2/2008 |
| CN | 101523634 | 9/2009 |

(Continued)

*Primary Examiner* — Kyoung Lee
*Assistant Examiner* — Christina Sylvia
(74) *Attorney, Agent, or Firm* — Cozen O'Connor

(57) ABSTRACT

An optoelectronic device is provided which comprises an organic active layer (5) provided for generating electromagnetic radiation and a first electrode (1) provided for electrical contacting of the active layer, wherein the first electrode comprises a first electrode layer (11) and a first connection layer (12) spaced at least in places from the first electrode layer, the active layer is arranged at least in places between the first electrode layer and the first connection layer, and the first electrode comprises at least one through via (13) which extends through the active layer and, in so doing, forms an electrical contact between the first electrode layer and the first connection layer. A method for producing such a device is furthermore provided.

15 Claims, 4 Drawing Sheets

(52) U.S. Cl.
CPC ...... *H01L 51/5218* (2013.01); *H01L 51/5221* (2013.01); *H01L 51/5225* (2013.01); *H01L 51/56* (2013.01); *H01L 2251/5361* (2013.01)

(58) Field of Classification Search
CPC .. H01L 51/5218; H01L 51/5212; H01L 23/06
See application file for complete search history.

(56) References Cited

U.S. PATENT DOCUMENTS

| | | | |
|---|---|---|---|
| 2011/0215362 A1* | 9/2011 | Ono | H01L 21/56 257/99 |
| 2013/0087824 A1* | 4/2013 | Van Den Brand | H01L 51/448 257/99 |

FOREIGN PATENT DOCUMENTS

| | | |
|---|---|---|
| CN | 101965654 | 2/2011 |
| DE | 10 2006 060 781 | 4/2008 |
| DE | 10 2008 020 816 | 9/2009 |
| EP | 2 363 905 | 9/2011 |
| JP | 2006 040802 | 2/2006 |
| WO | WO 2010/066245 | 6/2010 |
| WO | WO 2011/004311 | 1/2011 |
| WO | WO 2011/108921 | 9/2011 |

\* cited by examiner

OPTOELECTRONIC DEVICE AND METHOD FOR PRODUCING AN OPTOELECTRONIC DEVICE

RELATED APPLICATIONS

This is a U.S. National Phase Application under 35 USC 371 of International Application PCT/EP2013/074174 filed on Nov. 19, 2013.

This application claims the priority of German application no. 10 2012 221 191.8 filed Nov. 20, 2012, the entire content of which is hereby incorporated by reference.

FIELD OF THE INVENTION

The present application relates to an optoelectronic device and to a method for producing an optoelectronic device.

BACKGROUND OF THE INVENTION

Achieving homogeneous current feed to an organic light-emitting diode (OLED) with a large light-emitting area is a technical challenge. In a conventional OLED, the radiation generated by the OLED initially passes through an electrode layer before the radiation leaves the OLED. The electrode layer should therefore be designed to have the greatest possible radiation transmission and simultaneously have good electrical conductivity. As the device increases in size, in particular as the light-emitting area of the OLED gets larger, there is an increasing necessity additionally to increase conductivity by using conductor tracks ("busbars"). The result of this, however, is that the light-emitting area of the OLED is reduced due to the busbars' covering the radiation-transmissive electrode layer.

SUMMARY OF THE INVENTION

One object of the invention is to provide an optoelectronic device with maximally homogeneous current feed combined with the least possible loss of light-emitting area of the device and a method for producing such an optoelectronic device.

According to one embodiment, an optoelectronic device comprises an organic active layer provided for generating electromagnetic radiation and a first electrode provided for electrical contacting of the active layer. The first electrode preferably comprises a first electrode layer and a first connection layer spaced at least in places from the first electrode layer. The active layer is here arranged at least in places between the first electrode layer and the first connection layer. Moreover, the first electrode comprises at least one through via which extends completely through the active layer. When the device is in operation, the through via forms an electrical contact between the first electrode layer and the first connection layer.

For the purposes of the application, a through via is taken to mean a component of an electrode of the optoelectronic device which extends completely through at least one layer which is not associated with this electrode and, when the optoelectronic device is in operation, forms an electrical contact between further components of the electrode which are spatially spaced from one another at least in places. "Extends through a layer" means that the through via in particular penetrates the one layer and is preferably surrounded on all sides by said layer.

The first electrode is preferably of multilayer construction. It here comprises at least the first electrode layer, the first connection layer and the at least one through via. The first electrode preferably takes the form of an anode of the optoelectronic device. The active layer is preferably enclosed in a vertical direction at least in places by the first electrode. The active layer preferably directly adjoins the first electrode layer. A vertical direction is taken for the purposes of the application to mean a direction which is oriented perpendicular to a main plane of extension of the first electrode layer. The first connection layer is preferably spaced at least in places in a vertical direction from the first electrode layer. In other words, the first connection layer and the first electrode layer are preferably arranged one above the other. The first electrode layer and the first connection layer are preferably parallel to one another at least in places.

The first electrode layer is preferably of radiation-transmissive construction. For example, the first electrode layer transmits at least 70%, preferably at least 80%, particularly preferably at least 90% of the radiation generated by the active layer. The first electrode layer preferably contains a TCO (transparent conductive oxide) material. Such transparent conductive oxides are as a rule metal oxides, such as for example zinc oxide, tin oxide, cadmium oxide, titanium oxide, indium oxide or indium-tin oxide (ITO).

The first connection layer preferably takes the form of a radiation-reflecting layer. The connection layer and the through via preferably comprise at least one base material with elevated electrical conductivity. A base material of a layer is taken to mean a material which forms at least 50%, in particular at least 70%, of the layer. Examples of such a base material are metals such as copper, aluminium, silver or a alloy with at least one of the stated metals. The connection layer and the through via particularly preferably have a higher electrical conductivity than the first electrode layer.

According to one embodiment, the active layer comprises an organic functional layer stack with at least one organic light-emitting layer. The organic functional layer stack may comprise layers with organic polymers, organic oligomers, organic monomers, organic small, non-polymeric molecules ("small molecules") or combinations thereof. It may in particular be advantageous for the organic functional layer stack to comprise an organic functional layer which takes the form of a hole-transport layer, in order to allow effective hole injection into the at least one light-emitting layer. Materials which may prove advantageous for a hole transport layer are for example tertiary amines, carbazole derivatives, conductive polyaniline or polyethylene dioxythiophene. Materials suitable as materials for the at least one organic light-emitting layer are materials which have radiation emission based on fluorescence or phosphorescence, for example polyfluorene, polythiophene or polyphenylene, or derivatives, compounds, mixtures or copolymers thereof. Furthermore, the organic functional layer stack may comprise a functional layer which takes the form of an electron-transport layer. Moreover, the layer stack may also comprise electron- and/or hole-blocking layers. The organic functional layer stack may also comprise a plurality of organic light-emitting layers arranged between the electrodes.

With regard to the fundamental structure of an organic light-emitting device, for example with regard to the structure, the layer composition and the materials of the organic functional layer stack, reference is here made to document WO 2010/066245 A1, which is hereby explicitly included by reference in particular in relation to the structure, the layer composition and the materials of an organic light-emitting device.

According to one embodiment, the first electrode comprises a plurality of through vias which form a through via structure of the device. The through via structure effectively improves the transverse conductivity of the first electrode layer, such that homogeneous current feed into the active layer of the device is achieved. It is possible to dispense with busbars, such that the radiation generated by the active layer can pass through the first electrode layer and exit from the optoelectronic device without being absorbed by busbars or conductor tracks on a radiation exit face.

The through vias are preferably arranged uniformly on the first electrode layer. A uniform arrangement of the through vias results in a uniform current distribution on the first electrode layer.

According to a further embodiment, the optoelectronic device comprises a radiation-transmissive carrier body. The carrier body preferably contains glass or consists of glass. On a side of the carrier body remote from the first electrode layer, the carrier body comprises a radiation exit face of the device. The first electrode layer is furthermore preferably arranged between the radiation-transmissive carrier body and the active layer. The first electrode layer particularly preferably directly adjoins the carrier body. The means that, between the first electrode layer and the carrier body, there is at most one bonding layer for fastening the first electrode layer to the carrier body. Such an arrangement minimises radiation loss due to absorption, since the radiation can exit from the device by the shortest possible path.

According to one variant embodiment, the radiation exit face is preferably of planar configuration. In other words, the radiation exit face preferably has no curvature. The radiation preferably leaves the device directly at the radiation exit face. The radiation exit face of the device is preferably between 0.1 square centimeters and 1 square meter, in particular between 100 square centimeters and 0.5 square meter. The radiation exit face is particularly preferably a contiguous area.

According to a further embodiment, the optoelectronic device comprises a second electrode provided for electrical contacting of the active layer. The first electrode preferably takes the form of a cathode of the optoelectronic device. The second electrode comprises at least one second electrode layer. The first connection layer and the second electrode layer are preferably arranged on a side of the active layer remote from the carrier body. For example, the first connection layer and the second electrode layer overlap in plan view onto the carrier body. The second electrode layer is preferably arranged at least in places between the active layer and the first connection layer. The second electrode layer particularly preferably directly adjoins the active layer.

According to a further embodiment, the second electrode layer preferably takes the form of a mirror layer for the electromagnetic radiation generated by the active layer. Reflection of radiation on the second electrode layer advantageously increases the degree of radiation outcoupling and thus the efficiency of the device. It is also conceivable for the second electrode layer to comprise a radiation-reflecting layer on a side facing the active layer. The radiation-reflecting layer is for example a silver layer.

According to a further embodiment, the active layer and the second electrode layer comprise at least one cutout to the first electrode layer. The cutout is preferably surrounded on all sides in the lateral direction by the active layer and by the second electrode layer. A lateral direction is taken to mean a direction which is perpendicular to the vertical direction.

The through via is arranged at least in places within the cutout. At least one insulation layer for electrical insulation is preferably arranged between the active layer and the through via and between the active layer and the first connection layer. The active layer and the second electrode layer are preferably electrically conductively connected via the first electrode layer with the through via and the first connection layer.

According to a further embodiment, a first insulation layer is preferably arranged within the cutout between the through via and the active layer, and a second insulation layer is arranged between the through via and the second electrode layer. The first insulation layer and the second insulation layer preferably adjoin one another in the cutout. It is also conceivable for the first insulation layer and the second insulation layer to be produced in one production step and therefore to be part of a common insulation layer.

According to a further embodiment, the through via structure of the device preferably comprises a plurality of through vias which are spaced apart from one another in the lateral direction. The through vias are thus electrically connected with one another for example only via the first electrode layer or via the first connection layer.

According to one variant embodiment, the through vias adjoin one another laterally at least in places. They thus preferably form a contiguous through via structure. This means in particular that, when the semiconductor device is in operation, the through vias are electrically conductively connected to one another directly and not for example only via the first electrode layer or the first connection layer.

The contiguous through via structure is for example E-shaped, H-shaped or F-shaped. It is also conceivable for the contiguous through via structure to have other shapes such that the second electrode layer remains contiguous. In the case of a contiguous through via structure, the individual through via is preferably strip-shaped. "Strip-shaped through via" means that the through via has a cross-section, for example in plan view onto the active layer, the lengthwise extent of which is preferably at least twice as large, particularly preferably at least five times as large, as the crosswise extent thereof. The cutouts directly adjoin one another in the lateral direction at least in places. The insulation layers formed in the cutouts are preferably likewise contiguous, whereby formation of the insulation layer is simplified.

According to one variant embodiment, the contiguous through via structure preferably subdivides the second electrode layer and/or the active layer into a plurality of sub-regions separate from one another. In other words, the sub-regions are spatially spaced from one another in the lateral direction.

The second electrode is preferably of multilayer construction at least in places. In addition to the second electrode layer, the second electrode preferably comprises a second connection layer. When the device is in operation, the second electrode is here preferably electrically contacted via the second connection layer with an external voltage source. The first connection layer is here preferably arranged at least in places between the second connection layer and the second electrode layer. The second electrode furthermore preferably comprises a plurality of further through vias which are provided for electrical contacting of the second connection layer with the second electrode layer. The further through vias preferably extend from the second connection layer through the first connection layer to the second electrode layer. The sub-regions of the second electrode layer spaced from one another may thus be electrically conductively connected with one another by means of the further through vias.

According to a further embodiment, the optoelectronic device comprises at least one further insulation layer. The further insulation layer is preferably provided for electrical insulation between the first electrode and the second electrode. The further insulation layer is arranged at least in places between the first connection layer and the second connection layer. The further insulation layer preferably extends at least in places between the first connection layer and the further through vias. The further insulation layer preferably adjoins the second insulation layer.

According to one embodiment, a method for producing an optoelectronic device comprises the following steps. First of all, a carrier body is provided. A first electrode layer is applied onto the carrier body. An organic active layer is formed on the first electrode layer. The active layer comprises at least one cutout, wherein the cutout extends through the active layer. The cutout is preferably formed on formation or after formation of the active layer. At least one through via is preferably formed at least in places in the cutout, such that the first connection layer is electrically conductively connected with the first electrode layer by means of the through via.

These method steps ensure electrical contacting of the first electrode layer with the first connection layer through the organic active layer by means of the through via.

In particular, an optoelectronic device as described above may be produced by means of the method. Features described in connection with the optoelectronic device may also be used for the method and vice versa.

According to one embodiment, an organic active layer is preferably applied onto the first electrode layer after application of the first electrode layer, such that the active layer adjoins the first electrode layer. The first electrode layer is here preferably arranged between the carrier body and the active layer.

According to a further embodiment, at least one cutout is formed which extends through the active layer, such that the first electrode layer is preferably at least in places free of the active layer on a side of the electrode layer facing the active layer. This may be achieved for example by partial removal of the active layer. Alternatively, the organic active layer is preferably applied onto the first electrode layer in patterned manner. For example, at least one location on the first electrode layer intended for the cutout may be masked with a mask or with a masking material. The cutout is then formed for example by removing the mask or by at least partially removing the masking material.

According to a further embodiment, a first insulation layer and a second insulation layer are formed at least in places in the cutout. Within the cutout, the first insulation layer preferably directly adjoins the active layer in the lateral direction. The second insulation layer extends at least in places in the cutout and preferably directly adjoins the second electrode layer in the lateral direction.

The first insulation layer is preferably formed in the cutout prior to application of the second electrode layer. The first insulation layer reduces the risk of a short circuit between the second electrode layer and the first electrode layer during application of the second electrode layer. The second insulation layer is preferably formed after application of the second electrode layer in such a manner that the second insulation layer extends at least in places on the second electrode layer and in the cutout. The first insulation layer and the second insulation layer are accordingly produced in two method steps which are separate from one another. Alternatively, the first insulation layer and the second insulation layer may be formed for example in a common method step. They preferably form a common insulation layer.

Further advantages, preferred embodiments and further developments of the optoelectronic device and of the method are revealed by the exemplary embodiments explained below with reference to FIGS. 1A to 3E.

Figure 1A:
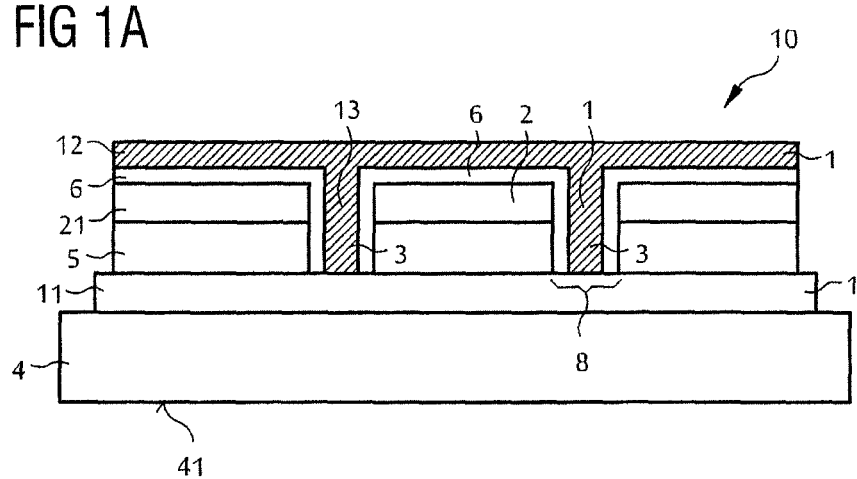
FIG. 1A shows a first exemplary embodiment of an electronic device in schematic sectional view.

Identical, similar or identically acting elements are provided with identical reference numerals in the figures. The figures are in each case schematic representations and are therefore not necessarily true to scale. Rather, comparatively small elements and in particular layer thicknesses may be illustrated on an exaggeratedly large scale for clarification.

DETAILED DESCRIPTION OF THE DRAWINGS

A first exemplary embodiment of an optoelectronic device is shown in schematic sectional view in FIG. 1A.

The optoelectronic device 10 comprises a carrier body 4, an organic active layer 5, a first electrode 1 and a second electrode 2. The first and the second electrodes are for provided for electrical contacting of the active layer. When the device is in operation, the active layer emits electromagnetic radiation, for example in the ultraviolet, visible or infrared spectral range.

The first electrode 1 comprises a first electrode layer 11 which is arranged directly on the carrier body 4. The first electrode 1 furthermore comprises a first connection layer 12 which is arranged on the carrier body 4 spaced in the vertical direction from the first electrode layer 11. The first electrode layer 11 may be a layer of a transparent, electrically conductive oxide, for example indium-tin oxide.

The organic active layer 5 is located between the first electrode layer 11 and the first connection layer 12. The active layer 5 directly adjoins the first electrode layer 11.

When the device 10 is in operation, the first electrode 1 is preferably electrically contacted with an external voltage source via the first connection layer 12. The first connection layer 12 is electrically contacted for example with the external voltage source when the device is in operation. This means that the device 10 can be contacted from a side of the active layer 5 remote the first transparent electrode layer 11, i.e. from the back.

The second electrode 2 comprises a second electrode layer 21 which is arranged between the active layer 5 and the first connection layer 12. The second electrode layer 21 directly adjoins the active layer 5. The active layer and the second electrode layer terminate flush with one another in the lateral direction. The second electrode layer 21 may be radiation-opaque. In particular, the second electrode layer 21 is of reflective construction for the radiation emitted by the device 10. This increases the degree of radiation outcoupling from the device.

The first electrode 1 furthermore comprises at least one through via 13. The through via may be part of the first connection layer 12 or directly adjoin the first connection layer 12. The through via 13 extends in the vertical direction from the first connection layer 12 completely through the second electrode layer 21 and completely through the active layer 5. The through via 13 likewise adjoins the first electrode layer 11. When the device 10 is in operation, the through via 13 forms an electrical contact between the first electrode layer 11 and the first connection layer 12. The through via 13 and the first connection layer 12 provide current distribution in the lateral direction. Homogeneous current feed in the active layer 5 can be achieved by means of a plurality of through vias 13 which form a through via structure of the device 10. The through vias 13 and the first connection layer 12 accordingly bring about an improvement in transverse conductivity of the first electrode layer 11, without a radiation exit face 41 of the carrier body being shaded.

The through via 13 and the first connection layer 12 may be formed from an identical base material. It is also conceivable for the through via 13 and the first connection layer 12 to be formed from different base materials which differ from one another for example with regard to their thermal conductivity. The through via 13 may here have a higher thermal conductivity than the first connection layer. Such an embodiment improves heat dissipation from the active layer 5 and/or from the first electrode layer 11.

The device moreover comprises an insulation layer 6 for electrical insulation between the first electrode 1 and the second electrode 2 and between the active layer 5 and the through via 13. The insulation layer contains for example nonconductive oxides such as aluminium oxides, titanium oxides and silicon oxides, a nitride such as silicon nitride or nonconductive lacquer coatings.

The device 10 furthermore comprises at least one cutout 8. The cutout 8 extends completely through the second electrode layer 21 and through the active layer 5. The cutout 8 is accordingly a hole in the active layer 5 and in the second electrode layer 21. The through via 13 and the insulation layer 6 are arranged at least in part within the cutout 8. The through via 13 is entirely surrounded in the lateral direction by the insulation layer 6. Within the cutout 84, the through via 13 is electrically insulated from the active layer 5 and from the second electrode layer 21 by means of the insulation layer 6. Outside the cutout, the insulation layer 6 extends in the lateral direction between the first connection layer 12 and the second electrode layer 21. The insulation layer 6 adjoins the first connection layer 12 and the second electrode layer 21.

The carrier body 4 is of radiation-transmissive construction. The carrier body 4 may contain glass or consists of glass. The carrier body 4 comprises, on the side thereof remote from the first electrode layer 11, a radiation exit face 41 of the device. In other words, the radiation generated by the device exits from the device 10 at the radiation exit face 41. The radiation exit face 41 is of planar configuration. In other words, apart from production-related variations, the radiation exit face 41 has no curvature.

Figure 1B:
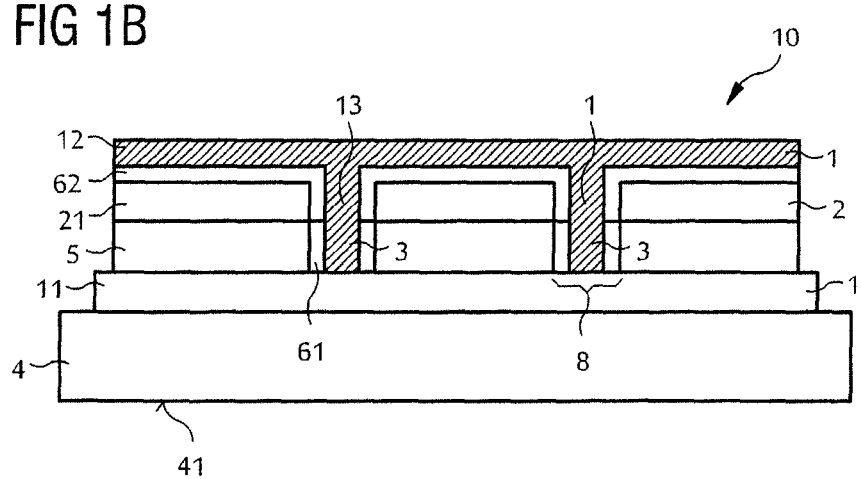
FIG. 1B shows a second exemplary embodiment of an electronic device in schematic sectional view.

A further exemplary embodiment of an optoelectronic device is shown in sectional view in FIG. 1B. This exemplary embodiment substantially corresponds to the first exemplary embodiment of the optoelectronic device in FIG. 1A. At variance therewith, the insulation layer 6 comprises a first insulation layer 61 and a second insulation layer 62. The first insulation layer 61 and the second insulation layer 62 directly adjoin one another in the cutout 8. In the vertical direction, the first insulation layer 61 terminates flush with the active layer 5. In other words, the first insulation layer 61 is completely surrounded in the lateral direction by the active layer 5, wherein the first insulation layer 61 and the active layer 5 have an identical vertical height. During application of the second electrode layer 21 onto the active layer 5, such a first insulation layer 61 can protect the first electrode layer 11 from a possible short circuit with the second electrode layer 21.

Outside the cutout 8, the second insulation layer is arranged in places between the first connection layer 11 and the second electrode layer 21. The second insulation layer 62 here provides electrical insulation between the first connection layer 12 and the second electrode layer 21. The first insulation layer 61 and the second insulation layer 62 may be formed from an identical base material. It is also conceivable for them in each case to comprise a different base material.

Figure 2A:
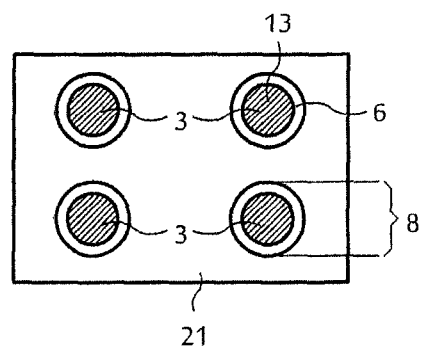
FIGS. 2A to 2C show different exemplary embodiments of a through via structure of the through vias in plan view at the level of the second electrode layer.

FIG. 2A shows a further exemplary embodiment of an electromagnetic device in a lateral sectional plane at the level of the second electrode layer 21. The first electrode 1 comprises a plurality of through vias 13 which form a through via structure 3 of the device. The through vias 13 are spatially spaced from one another in the lateral direction. The through vias 13 in each case have a cross-section which is circular. The cross-section may be constant along the vertical direction. It is conceivable for the cross-section to decrease as the distance from the first connection layer 12 increases. In other words, the cross-section of the through via 13 is tapered in the vertical direction from the first connection layer 12 to the first electrode layer 11. It is also conceivable for the cross-section of the through vias 13 to be strip-shaped, rectangular, elliptical, cross-shaped or other shapes. The through vias 13 may also have cross-sections of different shapes.

Each individual through via 13 is completely surrounded in the lateral direction by the insulation layer 6. The second electrode layer 21 comprises a plurality of cutouts 8, in each of which are arranged an insulation layer 6 and a through via 13. The cutout 8 has a cross-section which has the same shape as the cross-section of the associated through via 13. Apart from this, the cutout 8 and the associated through via 13 may have cross-sections of different shapes.

Figure 2B:
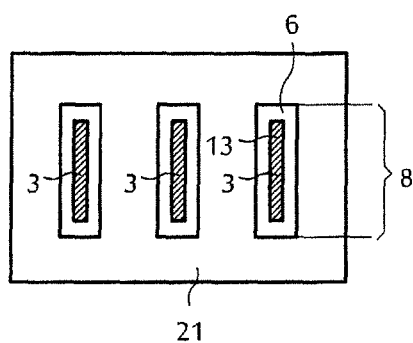

FIG. 2B shows a further exemplary embodiment of an optoelectronic device in schematic sectional view. This exemplary embodiment substantially corresponds to the exemplary embodiment in FIG. 2A. At variance therewith, the cross-section of the through via 13 is strip-shaped. In other words, in plan view onto the active layer, the through via has a cross-section, the lengthwise extent of which is preferably for example at least twice, in particular at least five times, as large as the crosswise extent thereof.

Figure 2C:
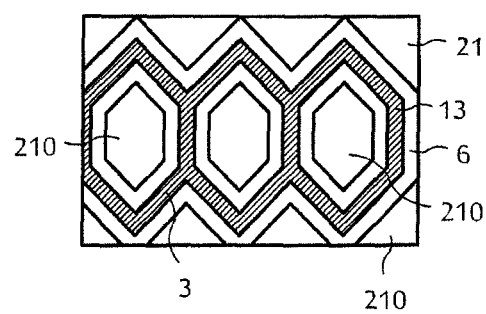

FIG. 2C shows a further exemplary embodiment of an optoelectronic device in schematic sectional view through the second electrode layer 21. The device comprises a plurality of through vias 13 which adjoin one another in places and thus form a contiguous through via structure 3. The through via structure 3 is surrounded in the lateral direction by a contiguous insulation layer 6.

The contiguous through via structure 3 subdivides the second electrode layer 21 into a plurality of sub-regions 210 which are separate from one another. The sub-regions are spatially spaced from one another in the lateral direction. FIG. 2C does not show the active layer 5 which is likewise subdivided by such a contiguous through via structure into a plurality of regions 50 which are separate from another. The contiguous through via structure 3 has, by way of example, a honeycomb-like structure. The individual through via is strip-shaped. It is also conceivable for the contiguous through via structure 3 to have a ladder-shaped, circular, spider's web-like or another contiguous structure.

Figure 3:
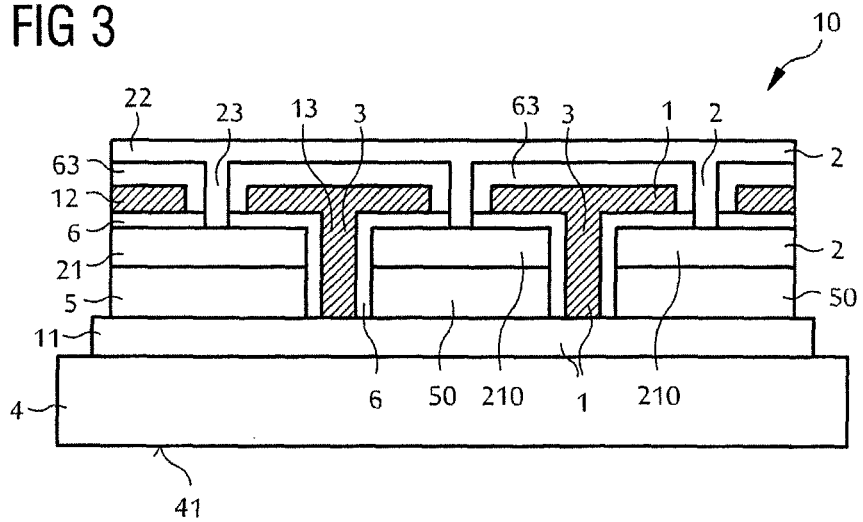
FIG. 3 shows a further exemplary embodiment of an electronic device in schematic sectional view.

FIG. 3 shows a further exemplary embodiment of an electronic device in sectional view. This exemplary embodiment substantially corresponds to the exemplary embodiment in FIG. 1A. At variance therewith, the second electrode 2 comprises the second electrode layer 21, a second connection layer 22 and a plurality of further through vias 23. Furthermore, the second electrode layer 21 is subdivided by the through vias 13, which form a contiguous through via structure 3, into a plurality of sub-regions 210 which are separate from one another. This means that the active layer 5 is likewise subdivided into a plurality of sub-regions 50 which are separate from one another.

The second connection layer 22 is arranged on a side of the first connection layer 12 remote from the second electrode layer 21. The first connection layer 12 is located between the second connection layer 22 and the second electrode layer 21. The further through vias 23 extend in the vertical direction from the second connection layer 22 completely through the first connection layer 12 to the sub-regions 210 of the first electrode layer 11. When the device 10 is in operation, the sub-regions 50 of the active layer are electrically conductively connected with one another by means of the further through vias 23.

The second connection layer 22 may likewise be subdivided into sub-regions which are separate from one another, wherein the sub-regions of the connection layer 22 in each case adjoin a further through via 23. In other words, the sub-regions of the connection layer 22 are in each case connected with at least one further through via 23, wherein when the device 10 is in operation the further through via 23 is in electrical contact with one of the sub-regions 50 of the active layer 5. Such a design of the second connection layer 22 makes it simpler to achieve targeted electrical contacting of the sub-regions 50 which are separate from one another of the active layer 5.

The device moreover comprises a further insulation layer 63 for electrical insulation between the first electrode 1 and the second electrode 2. The further insulation layer 63 is arranged in places between the second connection layer 22 and the first connection layer 12 and in places between the further through vias 23 and the first connection layer 12. The further insulation layer 63 adjoins the insulation layer 6.

FIGS. 4A to 4E show an exemplary embodiment of a method for producing an optoelectronic device with reference to intermediate steps which are in each case shown schematically in plan view. The device to be produced is shown schematically for example in FIG. 1B. The intermediate steps described below may also be used in the production of optoelectronic devices of the further described exemplary embodiments and combinations thereof.

Figure 4A:
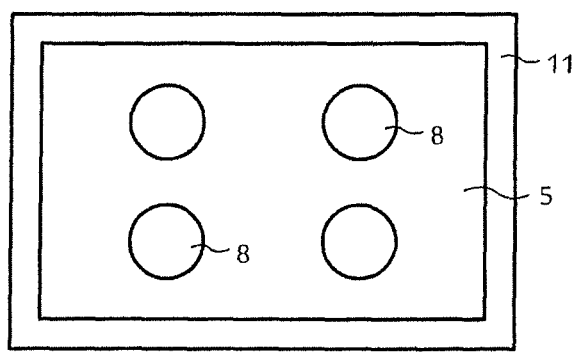
FIGS. 4A to 4E are schematic diagrams of the method steps according to one exemplary embodiment for producing an optoelectronic device.

In a first step, the carrier body 4 is provided. The first electrode layer 11 is applied onto the carrier. The organic active layer 5 and the cutout 8 are formed on the first electrode layer 11 (FIG. 4A).

The cutout 8 may for example be formed by partial removal of the active layer 5. Alternatively, the cutout 8 may be formed, for example by means of a mask, on formation of the active layer 5 on the first electrode layer 11. In other words, the active layer 5 may be applied onto the first electrode layer 11 in patterned manner. A masking material, for example a photopatternable masking material, may likewise be used instead of a mask.

Figure 4B:
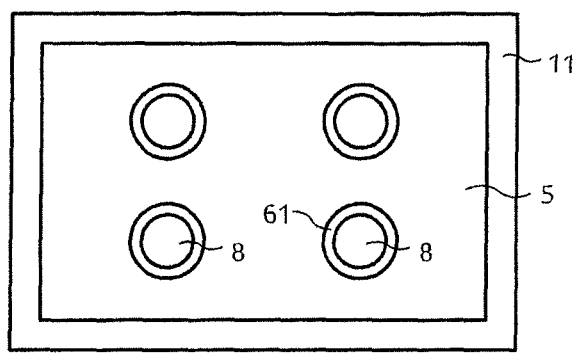

The first insulation layer 61 is formed in a further intermediate step (FIG. 4B). This may be achieved, for example, by applying an electrically insulating material into the cutout 8. It is also conceivable for the masking material to be an electrically insulating material, such that the first insulation layer is formed by partial removal of the masking material.

Figure 4C:
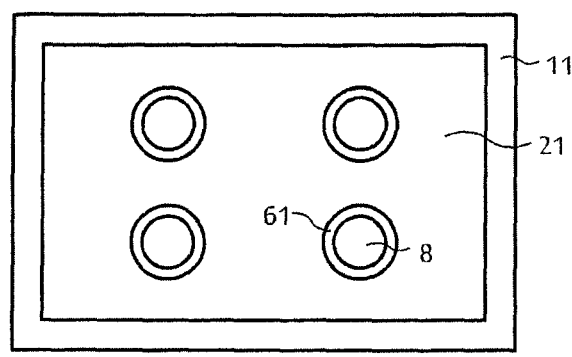

In a further intermediate step, the second electrode layer 21 is applied onto the active layer 5 (FIG. 4C). The cutouts 8 are here free of the second electrode layer. For example, the second electrode layer 21 is applied onto the active layer by vapour deposition. In a similar manner to the active layer 5, the second electrode layer 21 may for example be formed in patterned manner by means of a mask or a masking material. The first insulation layer 61 is preferably formed prior to application of the second electrode layer 21, whereby the risk of a short circuit between the second electrode layer 21 and the first electrode layer 11 is greatly reduced.

Figure 4D:
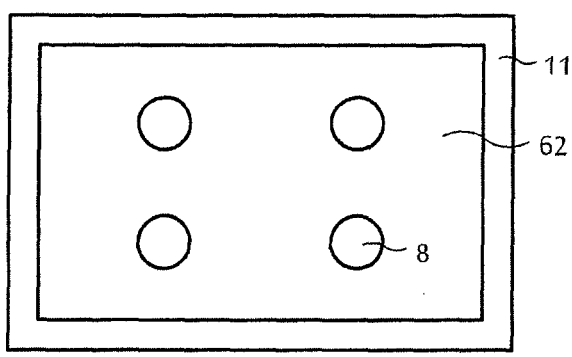

In a further intermediate step, the second insulation layer 62 is applied onto the second electrode layer 21 (FIG. 4D). The second insulation layer 62 completely covers the second electrode layer 21. Within the cutout 8, the second insulation layer 62 directly adjoins the first insulation layer 61. The regions of the cutouts 8 intended for the through vias 13 are free of the second insulation layer.

Figure 4E:
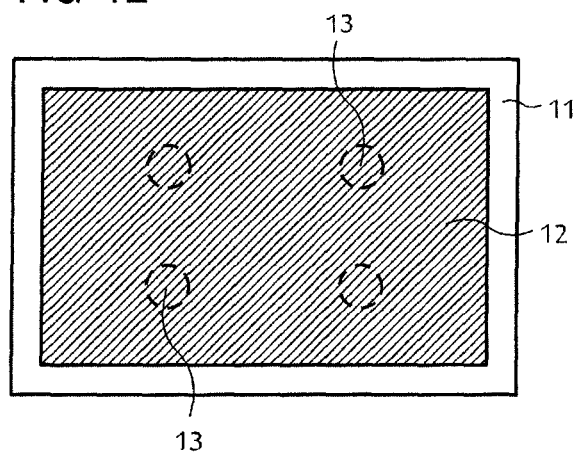

In a further intermediate step, the through vias 13 and the first connection layer 12 are formed (FIG. 4E). The regions of the cutouts 8 intended for the through vias 13 may here be filled with an electrically conductive material.

Thereafter, the first connection layer 12 is formed on the second insulation layer 62, for example applied by vapour deposition. The first connection layer 12 completely covers the second insulation layer 62 and the through vias 13. It is also conceivable for the through vias 13 and the first connection layer to be produced in a common method step.

Introducing through vias through the active layer creates an electrical connection between the first connection layer and the first electrode layer, whereby the transverse conductivity of the first electrode layer is effectively improved without a radiation exit face of the device being shaded for example by the busbars.

The description of the invention made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. An optoelectronic device having an organic active layer provided for generating electromagnetic radiation, a first electrode and a second electrode provided for electrical contacting of the active layer, wherein:
    the first electrode comprises a first electrode layer and a first connection layer spaced at least in places from the first electrode layer;
    the active layer is arranged at least in places between the first electrode layer and the first connection layer;
    the first electrode comprises at least one through via which extends through the active layer and forms an electrical contact between the first electrode layer and the first connection layer;
    the optoelectronic device comprises a contiguous through via structure wherein the continuous through via structure subdivides the second electrode layer into a plurality of sub-regions which are spaced from one another and wherein the contiguous through via structure subdivides the active layer into a plurality of regions which are separate from one another;

the second electrode has a second electrode layer which is arranged at least in places between the active layer and the first connection layer;

the second electrode comprises a plurality of further through vias and a second connection layer, wherein the second connection layer is subdivided into sub-regions being spaced from one another;

the further through vias extend throughout the first connection layer to the sub-regions of the second electrode layer; and the sub-regions of the second connection layer in each case adjoin one of the further through vias.

2. The optoelectronic device according to claim 1, wherein the second electrode layer takes the form of a mirror layer for the electromagnetic radiation generated by the device.

3. The optoelectronic device according to claim 1, wherein the first electrode layer is arranged between a radiation-transmissive carrier body and the active layer, and wherein the carrier body comprises a radiation exit face of the device on a side of the carrier body remote from the first electrode layer.

4. The optoelectronic device according to claim 3, wherein the first connection layer and the second electrode layer are arranged on a side of the active layer remote from the carrier body and overlap in plan view onto the carrier body.

5. The optoelectronic device according to claim 1, wherein the active layer and the second electrode layer comprise at least one cutout to the first electrode layer, wherein the at least one through via is arranged in the cutout.

6. The optoelectronic device according to claim 5, wherein:

within the cutout, a first insulation layer for electrical insulation is arranged between the through via and the active layer, and a second insulation layer for electrical insulation is arranged between the through via and the second electrode layer;

within the cutout, the first insulation layer and the second insulation layer adjoin one another; and outside the cutout, the second insulation layer is arranged between the first connection layer and the second electrode layer.

7. The optoelectronic device according to claim 1, wherein the contiguous through via structure is formed by a plurality of through vias which adjoin one another at least in places.

8. The optoelectronic device according to claim 7, wherein:

the first connection layer is arranged between the second connection layer and the second electrode layer; and the further through vias are configured for electrical contacting of the second connection layer and the second electrode layer.

9. The optoelectronic device according to claim 8, wherein a further insulation layer for electrical insulation is arranged between the first connection layer and the second connection layer and between the first connection layer and the further through vias, and wherein the further insulation layer directly adjoins the second insulation layer at least in places.

10. The optoelectronic device according to claim 7, wherein the through vias are in each case of strip-shaped configuration and, in plan view onto the active layer, have a cross-section, the lengthwise extent of which is at least twice as large as the crosswise extent thereof.

11. A method for producing an optoelectronic device comprising the steps of:

A) providing a carrier body;

B) applying a first electrode layer onto the carrier body;

C) forming an organic active layer with at least one cutout on the first electrode layer, wherein the cutout extends through the active layer;

D) forming at least one through via at least in places in the cutout, such that the through via adjoins the first electrode layer; and E) forming a first connection layer on a side of the active layer remote from the carrier body, such that, when the device is in operation, the first connection layer is conductively connected by means of the through via with the first electrode layer, wherein:

between step C) and step D), a second electrode layer with the cutout is formed directly on a side of the active layer remote from the carrier body;

the cutout extends through the active layer and through the second electrode layer; and a first insulation layer is formed in the cutout prior to application of the second electrode layer.

12. The method according to claim 11, wherein, after application of the second electrode layer, a second insulation layer is formed at least in places in the cutout, and wherein the second insulation layer adjoins the first insulation layer in the cutout.

13. The method according to the claim 11, wherein, prior to application of the second electrode layer, the first insulation layer is formed in the cutout and, after application of the second electrode layer, the second insulation layer is formed at least in places in the cutout.

14. An optoelectronic device with an organic active layer provided for generating electromagnetic radiation, a first electrode provided for electrical contacting of the active layer and a second electrode provided for electrical contacting of the active layer, wherein:

the second electrode has a second electrode layer;

the first electrode comprises a first electrode layer and a first connection layer spaced at least in places from the first electrode layer;

the active layer is arranged at least in places between the first electrode layer and the first connection layer;

the first electrode comprises a plurality of through vias which extend through the active layer and form an electrical contact between the first electrode layer and the first connection layer;

the through vias adjoin one another at least in places, such that the through vias form a contiguous through via structure, wherein the contiguous through via structure subdivides the second electrode layer into a plurality of sub-regions which are spaced from one another;

the contiguous through via structure subdivides the active layer into a plurality of regions which are separate from one another;

the second electrode comprises a second connection layer and a plurality of further through vias for electrical contacting of the second connection layer;

the further through vias extend through the first connection layer to the sub-regions; and the second connection layer is subdivided into sub-regions being spaced from one another, wherein the sub-regions of the second connection layer in each case adjoin one of the further through vias.

15. The optoelectronic device according to claim 14, wherein the second electrode layer is arranged at least in places between the active layer and the first connection layer.

* * * * *